United States Patent [19]

Hosokawa et al.

[11] Patent Number: 5,518,593
[45] Date of Patent: May 21, 1996

[54] SHIELD CONFIGURATION FOR VACUUM CHAMBER

[75] Inventors: Akihiro Hosokawa, Cupertino; Richard E. Demaray, Portola Valley; David E. Berkstresser, Los Gatos, all of Calif.

[73] Assignee: Applied Komatsu Technology, Inc., Tokyo, Japan

[21] Appl. No.: 303,098

[22] Filed: Sep. 8, 1994

Related U.S. Application Data

[63] Continuation-in-part of Ser. No. 236,715, Apr. 29, 1994.
[51] Int. Cl.$^6$ .................................................. C23C 14/34
[52] U.S. Cl. ................. 204/192.12; 204/192.13; 204/298.03; 204/298.09; 204/298.11; 118/641; 118/724
[58] Field of Search .................. 204/192.12, 192.13, 204/298.03, 298.09, 298.11; 118/724, 641

[56] References Cited

U.S. PATENT DOCUMENTS

| | | | |
|---|---|---|---|
| 4,933,063 | 6/1990 | Katsura et al. | 204/298.03 |
| 5,135,629 | 8/1992 | Sawada et al. | 204/192.12 |
| 5,202,008 | 4/1993 | Talieh et al. | 204/192.32 |
| 5,240,580 | 8/1993 | Henderson et al. | 204/192.12 |

FOREIGN PATENT DOCUMENTS 0584483  3/1994  European Pat. Off. ........ C23C 14/00

*Primary Examiner*—Aaron Weisstuch
*Attorney, Agent, or Firm*—Janis Biksa

[57] ABSTRACT

A shield in a PVD vacuum processing chamber having a configuration which minimizes or eliminates particulates originating from flaking or peeling off from the shield and from arcing between the biased target and surrounding grounded pieces is disclosed. The shield has an "h" cross section with the lower arch of the "h" facing a heater assembly which heats the shield to a temperature approximately equivalent to the temperature of the sputter deposited material. The surface of the shield is polished to promote the release of $H_2O$ molecules from its surface during the time when a vacuum is initially being pumped. The inside surface of the shield (facing a heater assembly) is treated to have a higher coefficient of surface emissivity than the outer surface to retain more energy and provide more efficient heating. A shadow frame which spans the gap between the edge of the shield and the edge of the substrate being processed is indirectly heated by having a portion of its surface facing a matching portion of the shield, both portions having high emissivities. The shield is supported in the vacuum chamber and the shadow frame on the shield by a series of knife edge support assemblies.

34 Claims, 13 Drawing Sheets

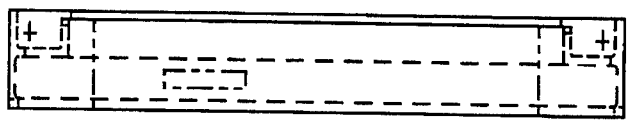
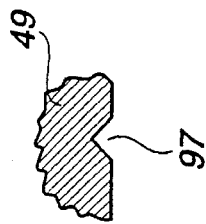
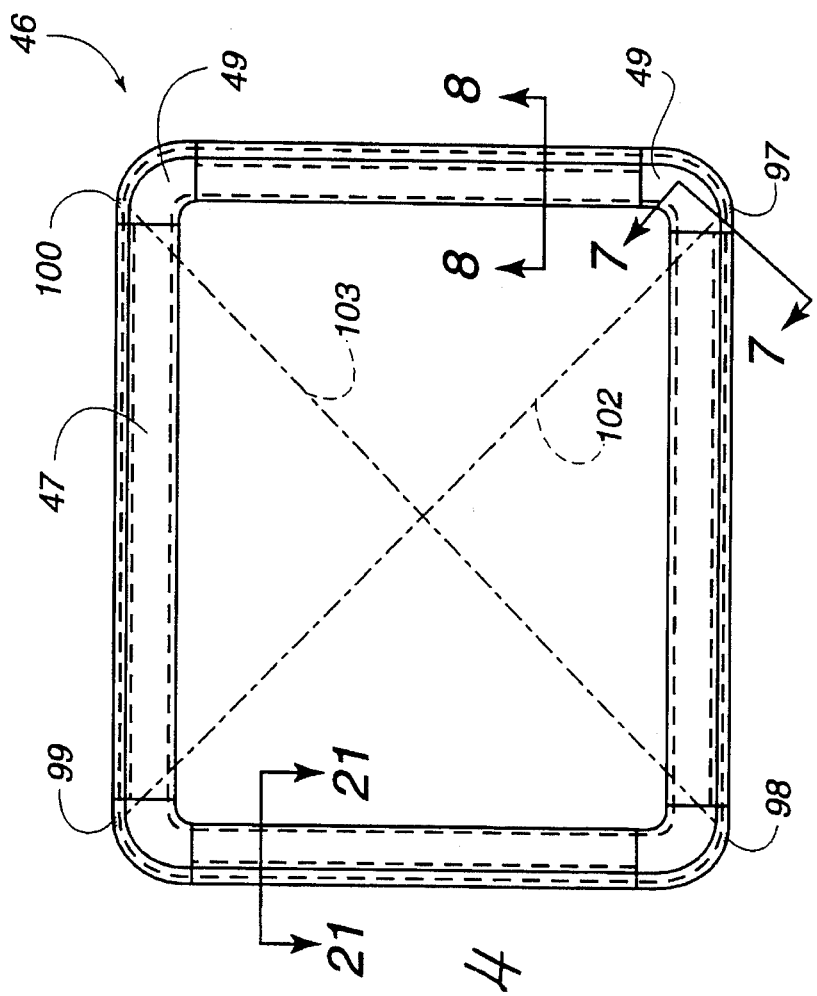
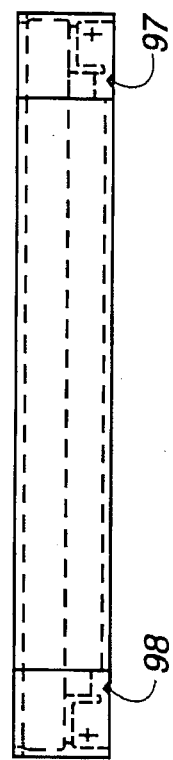

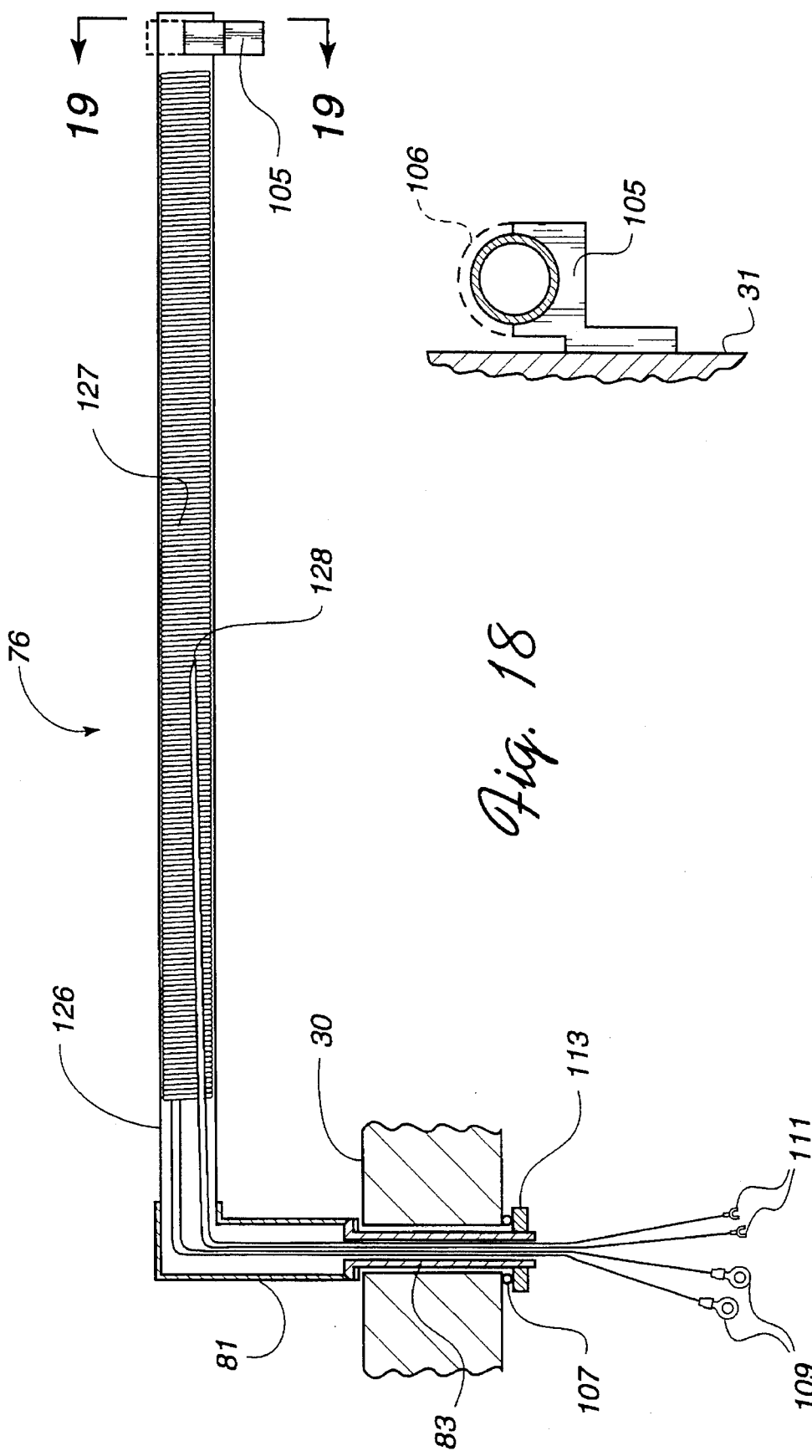

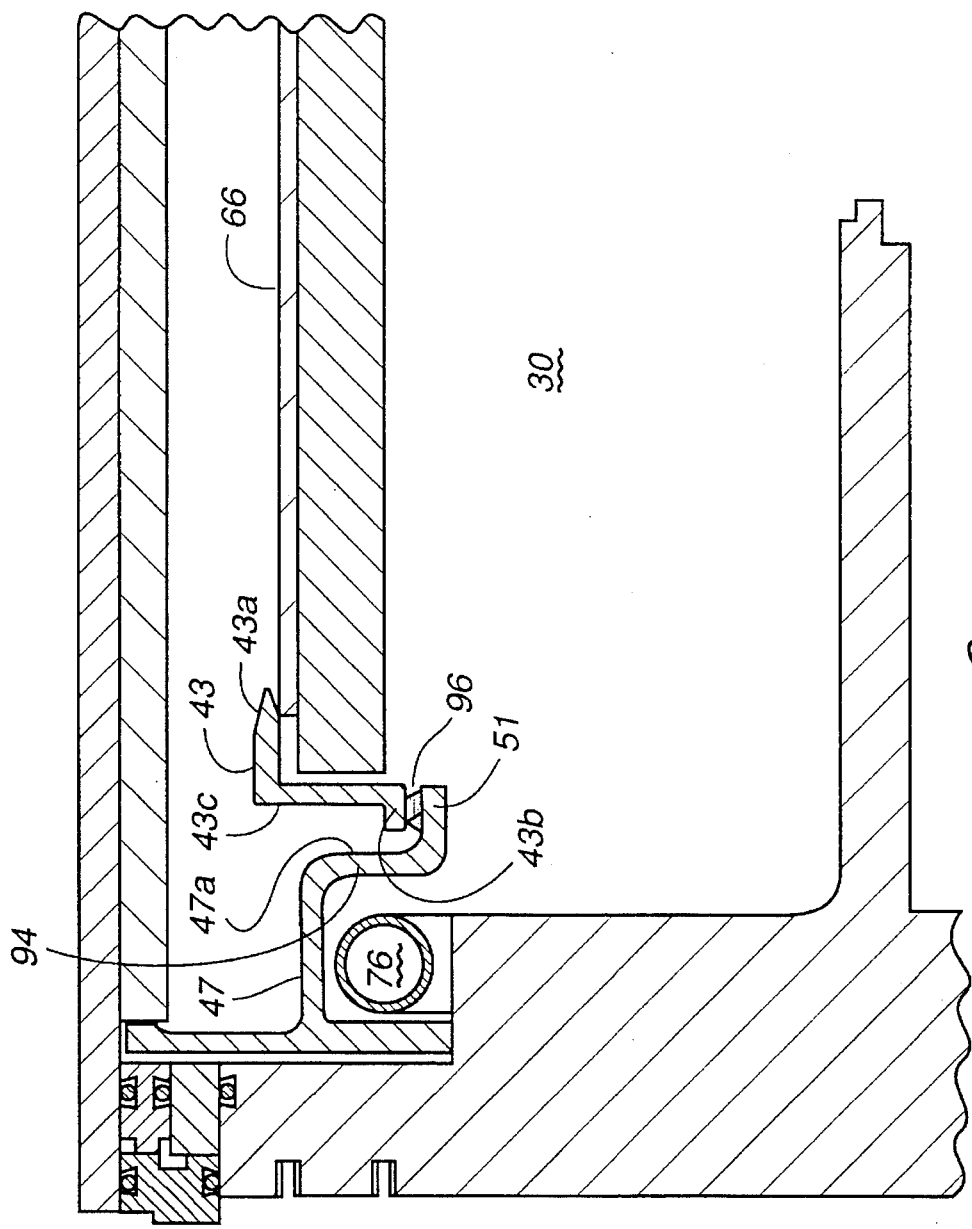

SHIELD CONFIGURATION FOR VACUUM CHAMBER

RELATED APPLICATIONS

This application is a continuation-in-part of Ser. No. 08/236,715 filed Apr. 29, 1994, by Demaray et al.

FIELD OF THE INVENTION

This invention relates to the structure and use of shields or linings used in vacuum processing chambers, and in particular to shields used in PVD (physical vapor deposition—sputtering) chambers for sputter depositing materials on large substrates.

BACKGROUND OF THE INVENTION

In substrate processing in general and in PVD (sputtering) processing in particular, particulates which are present and are generated in the processing chamber can contaminate and destroy the substrate being processed. When such particulates (also known as "free" particulates) land on the substrate being processed, they contaminate a small area of the substrate which can be discarded when die cut into separate chips. However, when a large substrate is intended for subsequent use as a single item (e.g. as a flat panel display), one defect causes the whole unit to be rejected.

The contaminating particulates originate from several sources. Incomplete or defective cleaning of the chamber allows particulates to remain in the chamber and cause contamination. However, even when the processing chamber is clean, contaminants can be and are generated during the sputtering process. One type of contaminating particulate originates from sputter deposited material which has deposited itself on processing chamber surfaces other than the substrate intended for deposition, and subsequentially detaches (peels off or falls off) from the location inside the vacuum processing chamber where it originally had been deposited. These particulates are usually cool, multi-molecular sized specks of sputter deposited material which were hot during the sputtering process, but have since cooled as a result of their contact with surrounding surfaces. But unlike the hot material being sputter deposited in which molecular sized particles of the material (at the high temperatures 250° to 400° C.) adhere freely to the already hot substrate being sputtered, When cool specks (particulates) land on and are embedded in the substrate, such specks can create defects which cause rejection of the substrate.

Another source of particulates is electrical arcing between the highly charged (biased) target and its surrounding uncharged (grounded) pieces. Arcing occurs in PVD processing chambers at locations between the edge of the target and surrounding surfaces (usually a shield enclosing the target and protruding into the space adjacent to the target which is known as "the dark space ring or groove"). Arcing between adjacent pieces causes a severe localized temperature spike which in most cases releases molecules of one or both of the materials between which the spark arcs. If the released molecules settle on the substrate, at best, they create a slight but acceptable anomaly in the coating pattern, or at worst when a particulate is a foreign material then the substrate will be contaminated and will have to be rejected.

In a PVD processing chamber, the target containing the material to be sputtered is generally flat and located parallel to the substrate which is to be sputter deposited. Sputtering involves the ionization of gas (e.g. argon) molecules in the processing chamber. The gas molecules are electrically ionized as a result of an electrical bias, usually a DC bias. Once ionized the positive ions bombard the negative biased target causing the target material to be released into the chamber as molecular size ballistic particles. In the rarified vacuum atmosphere of the vacuum chamber the target molecules travel nearly unobstructed until they reach the substrate being sputter deposited, which is located just a short distance away.

This sputtering activity coats the substrate as desired by the process, but since the target material being sputtered is emitted from the target in all directions, the surfaces in the processing chamber around the substrate also tend to become coated with sputter deposited material (e.g. the shadow frame, the chamber shield). Because these surrounding surfaces are initially generally cold, i.e. at ambient or room temperature, in contrast to the temperature of the sputter deposited material which is at 250° to 400° C., upon contact the sputter deposited material rapidly cools to the lower temperature of the process chamber surfaces surrounding the substrate. The initial contact and adhesion between the high temperature sputter deposited material and the cool chamber surfaces surrounding the substrate creates a contact area between the two materials. As the sputter deposited material cools it tends to contract on the cool internal surface of the chamber. Contraction of the new sputter deposited material is restrained by the adhesion between the two materials at the initial contact area. When the tension in the sputter deposited material increases (as a result of larger and larger areas of the inside the processing chamber having been coated) some of the sputter deposited material eventually peels off the chamber surface. Each instance when sputter deposited material peels off the chamber surface creates another particulate which can contribute to contamination. In acknowledgment of this problem PVD chambers are constructed with "shield" pieces which act as a lining for the processing chamber. A shadow frame and shield (collectively "shield")line the inside of the processing chamber substantially between the edge of the target being sputtered and the edge of the substrate intended for deposition. The sputter deposited material then coats the inside of the "shield" and not the inside of the chamber wall. The "shield" can then be easily removed and cleaned or replaced, which reduces the wear and tear on the chamber wall which would be encountered if the walls of the processing chamber were to be continuously exposed to the ionized process gas and required a thorough cleaning after a predetermined number of processing cycles.

However, even in those instances where a "shield" is used, the peeling phenomenon described above eventually occurs when sputtering material on the "shield" surface builds up to and beyond the capacity of the "shield" to retain it without peeling off. Bead blasting is a technique commonly used to improve the adhesion between the sputter deposited material and the "shield" surface. Bead blasting provides additional surface area for the sputter deposited material and can effectively provide a mechanical coupling between the sputter deposited material and the surface of the "shield" so that the sputter deposited material is retained on the surface of the "shield" and does not peel off creating particulates in the processing chamber.

Arcing around the edge of the sputtering target can also create particulates. Arcing is induced when the bias voltage between the target and a nearby grounded (or dissimilarly biased) member is greater than a known function of a multiplicative product of the gas pressure and gap spacing between the target and that nearby grounded (or dissimilarly bias) member. The known numerical relationship is given by Paschen's curves (details of which are considered below in discussing FIG. 16). The curve shows conditions which are conducive to arcing between the target material and the surrounding shield in the "dark space ring" for a particular gas. An arc jumps between the edges of the biased target and grounded pieces such as the "shield." The arc causes specks to erupt from the material. Such specks can and do contaminate the substrate.

The expansion and contraction of process chamber structures due to changes in their temperature affects the gap or clearance between pieces across which arcing might occur. More specifically, because of the differences in temperature among the target, the process chamber wall, and the shield, it is possible for an arc to occur not only at an inside edge of the dark space groove between the edge of the target and the edge of the shield facing the target material, but also at an outside edge of the dark space groove surrounding the target, such that when the target shrinks or the shield expands the magnitude of the gaps created between adjacent pieces cause arcing.

A common solution to this arcing problem is to keep the clearance between adjacent pieces (i.e. the shield and the target) under the low end of Paschen's curve to prevent arcing. However, it is difficult to keep a constant clearance between the shield and the target material since the shield expands and its temperature rises due to exposure to ionized gas particles and sputtered material during the process. It is especially difficult to maintain a desired range of clearance dimensions when sputtering is being done for liquid crystal display applications. In these applications, the size of the area being sputtered is large (470 mm×370 mm), requiring a long and wide shield (outside dimension 660 mm×570 mm) around the perimeter of target being sputtered. The larger dimensions create larger movements due to differential thermal expansion which are hard to design around. Further, even when designs are created which in theory provide acceptable performance at all temperatures, a slight misalignment or offset of the shield from the target material during assembly of the processing chamber can and does create a clearance at one side of the chamber which is conducive to arcing, and thus creates particulates. The thermal cycling of "shield" elements from energy supplied and lost as sputtering is turning on and off, puts the adhesive bond between the sputter deposited material and the "shield" pieces to a test. Weakly bonded specks will soon fall or peel off as a result of thermal cycling, exacerbating the problem of particulates in the processing chamber.

Particulates created either by sputter deposited material peeling off from process chamber surfaces or arcing are unacceptable as particulate contamination affects the yield rate of semiconductor production. These difficulties need to be overcome in order to increase the yield in production of sputtered substrates and reduce or eliminate substrate rejection because of particulate contamination where the particulates originate from the sputtering process and not from any imperfect prior cleaning process.

SUMMARY OF THE INVENTION

The invention solves, overcomes, or minimizes the above-stated problems by equalizing the temperature between the "shield" (shadow frame and shield (or heat shield)) and the sputter deposited material and by heating the "shield" approximately to the temperature of the sputter deposited material so that there is little or no differential thermal expansion between the sputter deposited material and the non-process surface on which it is deposited, thus eliminating the detrimental tensile stresses in the sputter deposited material.

The temperature of the heat shield is controlled by an assembly of radiant heaters which are configured to heat the underside of the shield without affecting the chamber process. Heating the shield causes it to expand. The target material also expands so that the actual change in clearance between the edge of the target and the edge of the shield in the dark space ring groove is minimized.

The target material is usually cooled by a liquid such as water to prevent it from overheating, so even though the sputter deposited material when ejected from the target has a localized temperature of 250° to 400° C., the whole mass of the target material or target material and backing plate, in those instances where a backing plate is used, has an average temperature of 50° to 100° C. Therefore, a chairlike or "h" type cross section shield is provided with the front of the chair facing the center of the chamber. The upper back of the chair or the upper leg of the "h" type cross section extends up from the lower heated section of the shield to fit into the dark space ring groove around the target. While the temperature of the outer surface of the shield adjacent or directly opposite the heater is controlled at approximately 250° C.–350° C. (approximately the temperature of the sputter deposited material), the temperature of the surface of the heater assembly has a predetermined relationship (e.g. proportional) with the temperature of the shield outside surface, so that the temperature control of the heater can be accomplished by using a less sophisticated (e.g. proportional) control function, if desired.

Since the heater assembly is located under the seat of the chair or inside the lower arch of the "h", ideally the shield temperature would be uniform,, but in reality the temperature of the shield at the extreme top of the shape which is adjacent to the target is slightly different than temperature of the shield adjacent to the heater. Thus, the predictability of temperature differences and proper alignment between the target material and the shield, when the shield and process chamber are properly aligned one to the other, reduces the possibility of arcing during the full range of temperatures that might be experienced in the sputtering process.

To maintain the alignment between the shield and the dark space ring on the target, a series of four laterally extending knife edge supports are provided around the perimeter of the shield. The axes of the knife edges extend toward the center of the shield (generally also the center of the processing chamber). Any movement due to differential thermal expansion between the shield and the processing chamber walls is automatically equalized from the center of the chamber by the use of these knife edge supports whose axes cross at the center of the shield.

To improve the effect of the heater assembly on the shield temperature, an inside (bottom) surface of the shield has its surface treated (bead blasted or oxidized) to provide a high coefficient of emissivity while the outer (upper) surface is treated (preferably polished) to have a low coefficient of emissivity. The high coefficient of emissivity on the bottom surface of the shield facing the heater assembly causes the shield material to readily absorb and emit thermal energy due to radiation (which is the primary mode for heat transfer in vacuum environments). The low coefficient of emissivity on the upper surfaces of the shield causes the material of the shield to minimize absorption and emission of thermal energy due to radiative heat transfer. This arrangement causes the temperature of the shield material to be readily affected by a change in the thermal energy input from the heater assembly without much gain or loss due to radiation from upper shield surfaces.

The polished upper surfaces of the shield provide the added benefit of moisture removal. Moisture, which readily adheres to the inside of the processing chamber during times when the processing chamber is exposed to ambient atmospheric conditions, is more easily evaporated from the surface of the shield under high vacuum when the shield surface is smooth. A high vacuum can thereby be achieved much more quickly when using the same vacuum pumping equipment with polished internal surfaces than when a rough finish is left on the shield surface.

In some instances, it must be assured that the shield is free of moisture and other potentially volatile substances. Shield temperatures in the processing chamber are then raised to approximately to 450° C. to accelerate the bake-out of any moisture or other undesirable volatile substances which may have a tendency to stick to the rough cool surfaces of the processing chamber, which thereby resist or delay the pulling of a high vacuum in these processing chambers. Providing polished shield surfaces reduces the time needed for a bake-out, if it is needed at all.

In another configuration according to the invention, the "h" type cross section of a second shield includes a generally horizontal flange extending toward the center of the chamber from the end of the medial leg of the "h" cross section of the second shield. A Z-shaped shadow frame extends from the shield's flange over the edge of the sputtering pedestal (replacing the sputtering pedestal apron) and has a horizontal flange at its edge extending outwardly from the center of the chamber such that the Z-shaped shadow frame horizontal flange extends over the shield horizontal flange when in position in the processing chamber. However, to eliminate assembly misalignment and assure uniform expansion in all directions from the center of the chamber, the horizontally centrally extending flange of the second shield includes a series of two knife edge protrusions whose edges are aligned along two axes, similar to the knife edge features supporting the shield (described above). Similarly, the outwardly extending horizontal flange of the Z-shaped shadow frame includes knife edge grooves to mate with and be supported by the knife edge protrusions on the horizontal flange of the second shield.

To reduce the temperature difference between the Z-shaped shadow frame and the second shield, in the absence of the heat energy received from the sputtering process (the shadow frame by its close proximity to the substrate being sputtered, receives a large amount of heat during the sputtering process) a set of horizontal strips on facing surfaces of both the Z-shaped shadow frame and the second shield have high coefficients of emissivity. Heating of the second shield causes the temperature of the second shield to rise, causing the horizontal strip area of high emissivity on the outside of the second shield to emit thermal energy as radiation. Since the horizontal strip area on the outside of the shield faces a generally similar high emissivity horizontal strip area on the outside of the Z-shaped shadow frame, the shadow frame readily absorbs the thermal energy radiating to its high emissivity surface strip surface from the second shield. The Z-shaped shadow frame is thereby heated to minimize its cooling (range of thermal cycling) during the absence of energy from a sputtering process. The risk of particulates peeling off from such a Z-shaped shadow frame is thereby reduced.

Each of the techniques and configurations described above provide a benefit in accelerating the elimination of moisture in the processing chamber during the time when the vacuum is pulled or assist in reducing or eliminating particulate generation due to process conditions under which particulates may be created by the process itself.

BRIEF DESCRIPTION OF THE DRAWINGS

FIG. 4 is a top-plane view of an embodiment of a shield according to the invention;

FIG. 5 is a front elevation view of FIG. 4;

FIG. 6 is a right side elevation view of FIG. 4;

FIG. 7 is a cross sectional view of a knife edge groove according to the invention as taken at 7—7 in FIG. 4;

FIG. 18 shows a close-up side view of a heater unit mounted in a processing chamber according to the invention;

FIG. 19 shows an end view of the end support bracket of FIG. 18 from 19—19 supporting the end of a heater unit according to the invention;

FIG. 20 shows a close-up view of a processing chamber such as shown in FIG. 2, but showing another configuration of a shield and a shadow frame in the processing chamber according to the invention;

DETAILED DESCRIPTION

The configuration of the process chamber shield according to the invention as described herein overcomes many if not all of the drawbacks of the prior art.

Figure 1:
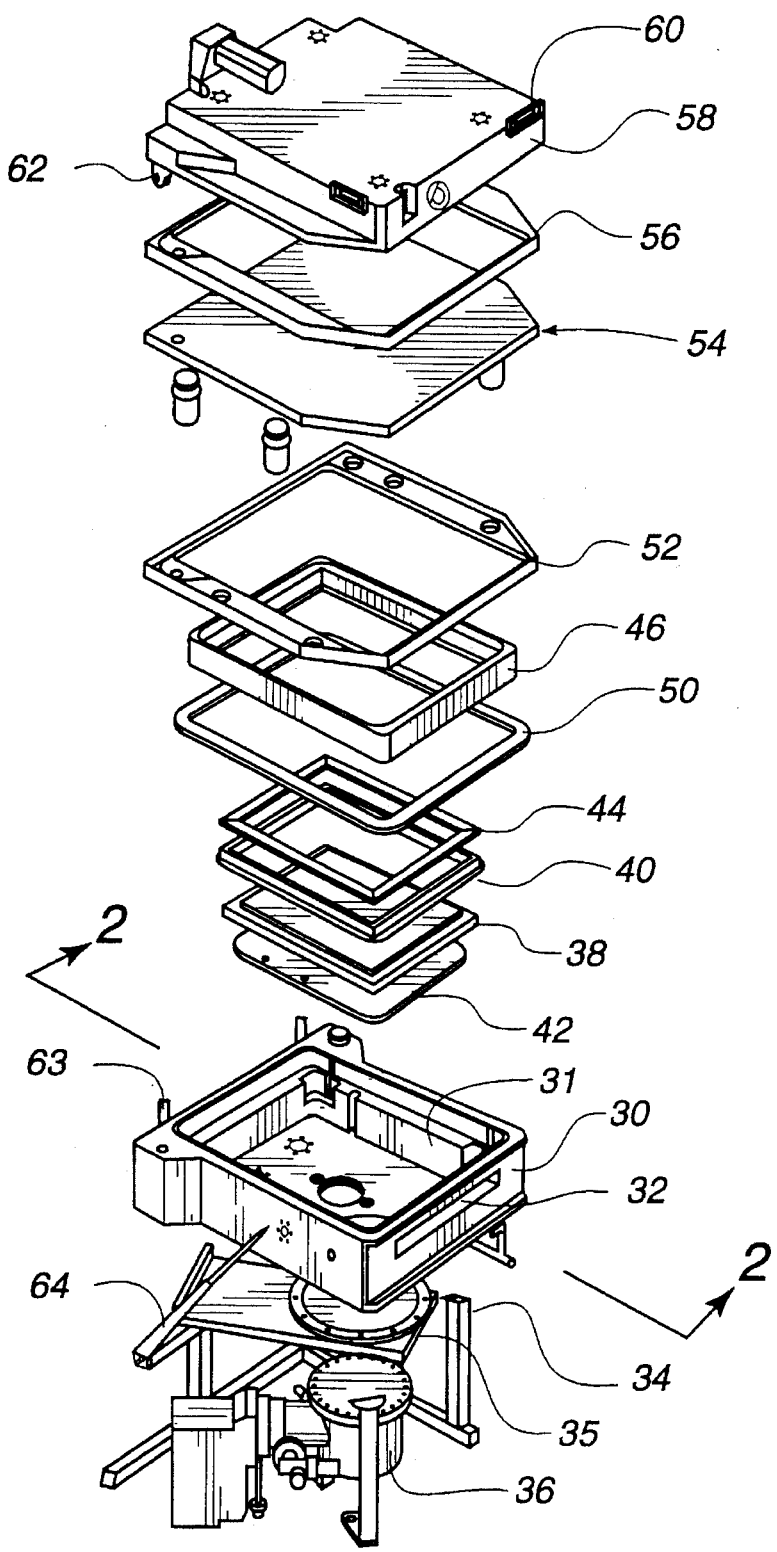
FIG. 1 an exploded view of a PVD vacuum processing chamber in which an embodiment according to this invention can typically be used.

FIG. 1 shows an exploded view of the pieces which are generally associated with a PVD sputtering processing chamber. More details are presented in U.S. patent application Ser. No. 08/236,715 filed on Apr. 29, 1994 by Demaray et al. A processing chamber 30 having an inside processing chamber wall 31 and a slit valve 32 is supported on a frame 34 leading to a gate valve 35 and a cryogenic vacuum pump assembly 36. The processing chamber 30 contains a susceptor or sputtering pedestal 38 supported above a fin plate 42. The sputtering pedestal 38 is surrounded by a sputtering pedestal apron 40. Once a substrate (not shown in FIG. 1) is supported on the sputtering pedestal 38, a shadow frame 44 covers the edges of the substrate during processing to prevent sputter deposited material from depositing at the edge and on the back side of the substrate. The substrate supported on the susceptor pedestal 38 faces a target or target assembly 54 which is supported on the top flange of the processing chamber 30 by an insulating ring 50 and a lower outer insulator 52. A shield (or shield assembly) 46 surrounds the sputtering pedestal 38 and extends closely adjacent to the target 54. The top side of the target assembly 54 is covered at its perimeter with an upper insulator 56 which supports a top cover 58 which both acts as a cap and houses a magnet drive assembly (not shown).

The top cover 58 often contains a cooling fluid, such as water, which is piped through the cover to cool the back side of the target assembly 54. In other configurations the target assembly 54 is cooled by sending fluid through passages in the target assembly to provide the necessary cooling. The top cover 58 as shown in the present configuration can be lifted by a lift handle 60 to swing on hinges 62, 63 such that the opening of the top cover 58 is assisted by one or more gas pressurized gate assisting rams 64 connected between the cap 58 and the frame 34 on either or both sides of the hinged processing chamber 30.

Figure 2:
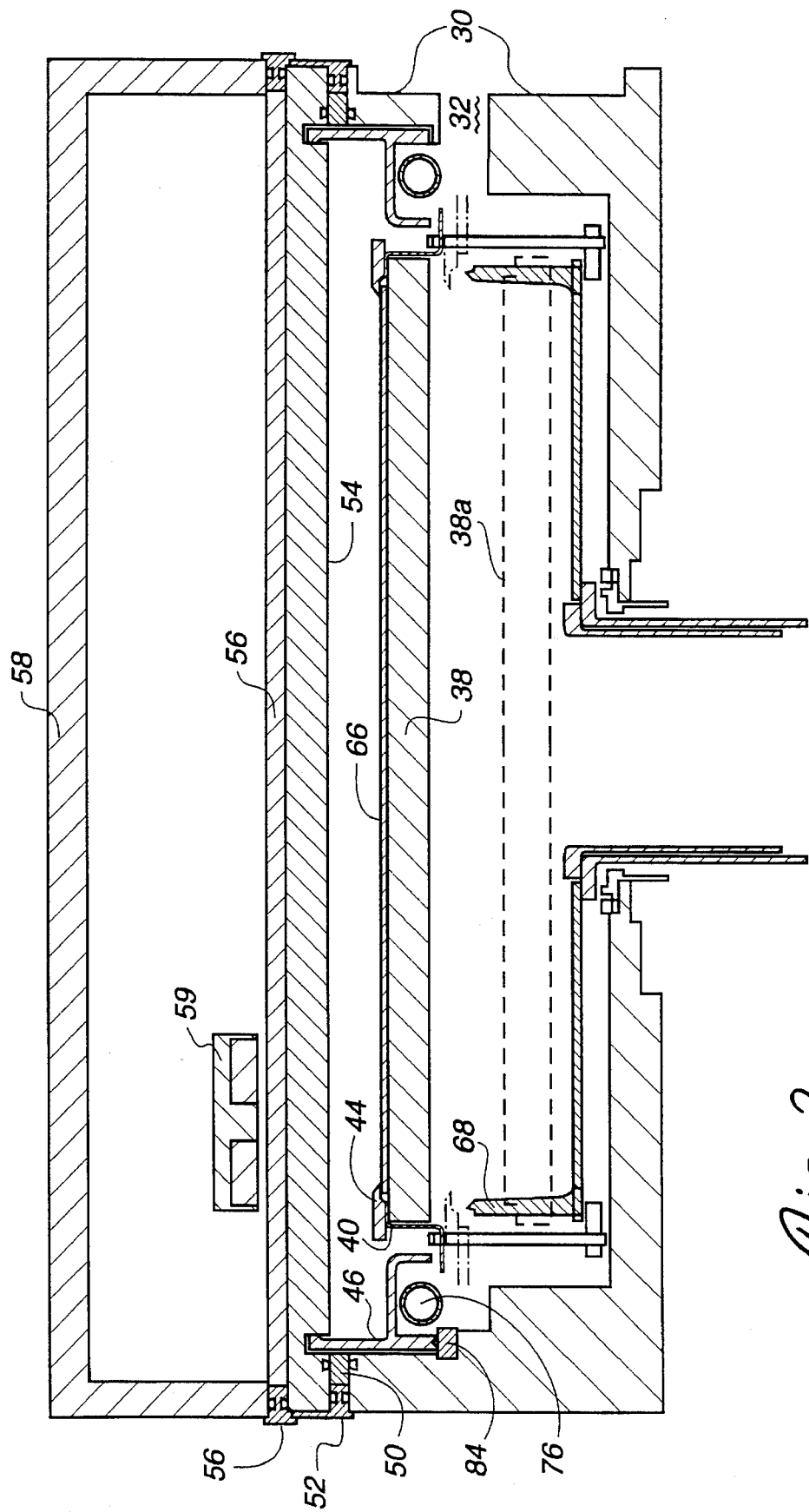
FIG. 2 is a cross section of a PVD vacuum processing chamber as shown in FIG. 1 assembled, taken at 2—2.
Figure 3:
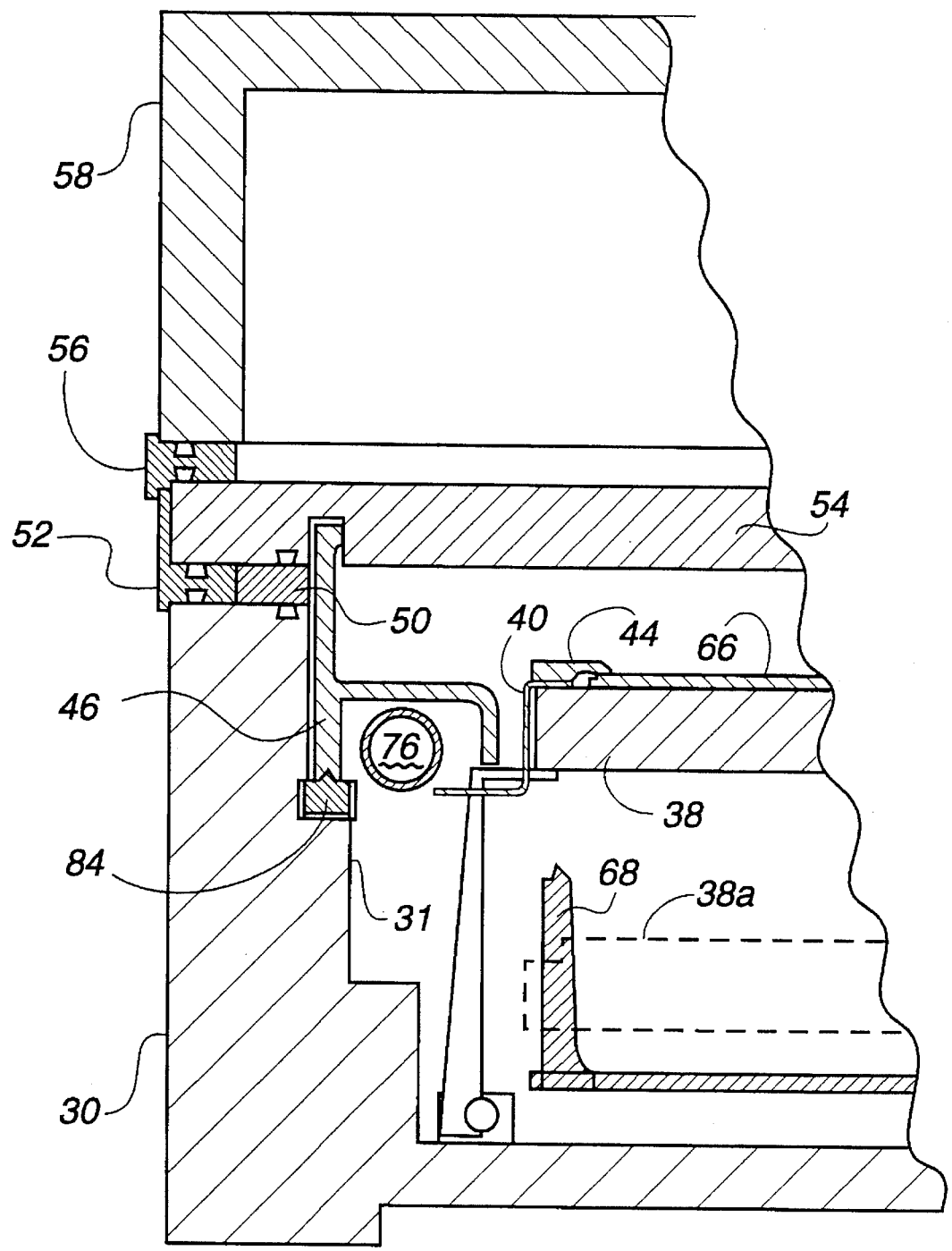
FIG. 3 is a close-up view of the left side of the cross section of the processing chamber shown in FIG. 2.

FIG. 2 shows a cross sectional view of the assembled processing chamber 30 that is shown in FIG. 1 in its unassembled state. A close-up detailed view of the left hand side of FIG. 2 is shown in FIG. 3 (an alternate configuration is shown in FIG. 20 discussed below). As can be seen at the left side of FIG. 2, the processing chamber 30 supports the insulating ring 50 surrounded by the lower outer insulator 52, both of which support the target assembly 54. The target assembly 54 may be solid as shown in FIG. 2 or may have fluid passages through it for cooling. The target assembly 54 may be a single piece, as shown, or the target assembly 54 may be a separate piece soldered or bonded by some other means to a target backing plate of a different material (as shown in FIG. 20). Often expensive materials need to be used as the target but they are not suitable for use as a target backing plate. For instance, indium-tin-oxide (ITO) is often used as a target material but titanium, aluminum, or copper are used as the backing materials because those materials conduct heat and electricity and provide strength at the elevated temperatures where a similar configuration of ITO without a backing plate cannot presently be created.

The target assembly 54, which is electrically biased, is covered and insulated from the outside by the lower outer insulator 52 and the upper insulator 56. The top cover 58 creates a chamber into which liquid can be provided to cool the back of the target assembly 54 or in which vacuum can be pulled to equalize the pressure with the process chamber.

A linearly scanning magnet carrier 59 typically provided in the top cover 58 assists in the sputtering process and reduces the waste caused by uneven erosion of the target material.

A substrate 66 is supported on the sputtering pedestal 38. The edges of the sputtering pedestal are covered by the sputtering pedestal apron 40 while the edges of the substrate 66 are covered by the shadow frame 44.

A robot paddle (not shown) moves the substrate 66 into position in the processing chamber through the slit valve 32, after the sputtering pedestal 38 is lowered to a position shown by its outline in dashed lines 38a. A lifter assembly 68 then lifts the substrate 66 from the robot paddle and the robot paddle withdraws. The sputtering pedestal 38 then rises to engage the substrate 66 to lift it and the shadow frame 44 to the processing position. Unloading is performed in reverse order.

Figure 13:
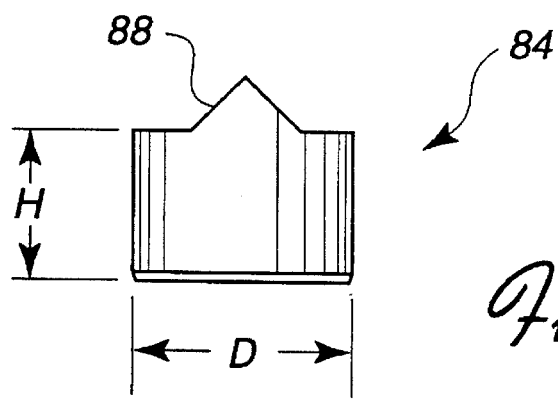
FIG. 13 shows a side view of a knife edge support cylinder according to the invention.

The pedestal 38, apron 40, and shadow frame 44 of the substrate support assembly (described above) are circumferentially surrounded by a shield 46 having a chairlike or "h" type cross section. The shield 46 acts as a removable lining in the processing chamber between the sputtering target and the substrate being sputtered. The shield is configured to have a cross section of a chair or an "h" with the front of the chair facing the center of the processing chamber, the target adjacent the top, and a heater between the legs. The bottom side of the chairlike cross section of the shield 46 is generally close to and exposed to a heater assembly consisting of one or more heater units (only heater unit 76 is shown in FIGS. 2, 13, and 20). The shield 46 is supported from a ledge of the processing chamber wall 31 which holds a series of knife edge support cylinders (such as 84).

FIGS. 4, 5, and 6 show the plan, front, and side views of the shield 46. The shield 46 includes shield straight sections 47 and shield corner sections 49, which, as can be seen in the dashed lines of the hidden views, are formed in the chairlike or "h" type cross section previously mentioned. The straight sections 47 and corner sections 49 are welded together using electron beam welding. The shield 46 is generally made of a metal (preferably 316L stainless steel). Knife edge receiving grooves 97, 98, 99, 100 are formed in the short linear portions of the shield corner sections 49 and are located on the bottom at the outside edge of the shield 46 along the long sides of the shield rectangle adjacent to the actual curve of the corner sections 49, but are positioned wholly within the shield corners sections 49. A close-up of these grooves in cross section can be seen in FIG. 7. The alignment of the ridge (or swale) of the grooves is along center lines 102 and 103 which run approximately 45° (in this example actually 46.5° to be symmetrical and avoid interfering with other items in the processing chamber) from the long side of the rectangle of the shield as shown in FIG. 4. The center lines 102 and 103 cross at the rectangular center of the shield which corresponds to the center of the processing chamber wall 31 during substrate processing.

Figure 8:
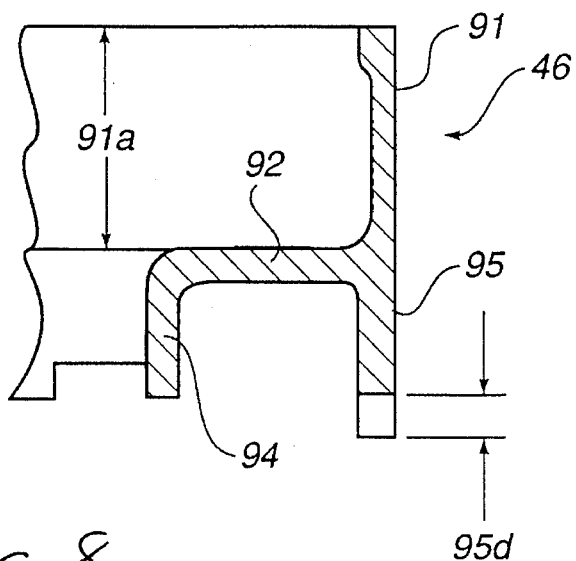
FIG. 8 is a cross sectional view of FIG. 4, taken at 8—8.

FIG. 8 shows a cross sectional cut of FIG. 4 at 8—8. The lengths of both the inner leg 94 (1.22"(31.0 mm)) and the outer leg 95 (1.58"(40.1 mm)) vary (e.g. dimensions 95d (0.36"(9.1 mm)) to avoid interference with features in the chamber wall (such as the slit valve opening 32 and sharp cornered protrusions from the chamber wall) which must be avoided to keep the shield fully floating and centered on its knife edge supports as discussed below. The height of the back of the chair 91a is 1.84"(46.7 mm) and it has a thickness of 0.20"(5.1 mm). The top 0.25"(6.35 mm) of the back of the chair 91 has a thickness of 0.030"(0.76 mm) to decrease the clearance between the top leg 91 of the shield 46 and the target assembly 54. The seat of the chair 92 has a length of 1.84"(46.7 mm) and a thickness of 0.25"(6.35 mm). The inner leg 94 has a thickness of 0.25"(6.35 mm) and the outer leg 95 has a thickness of 0.325" (8.25 mm).

Figure 9:
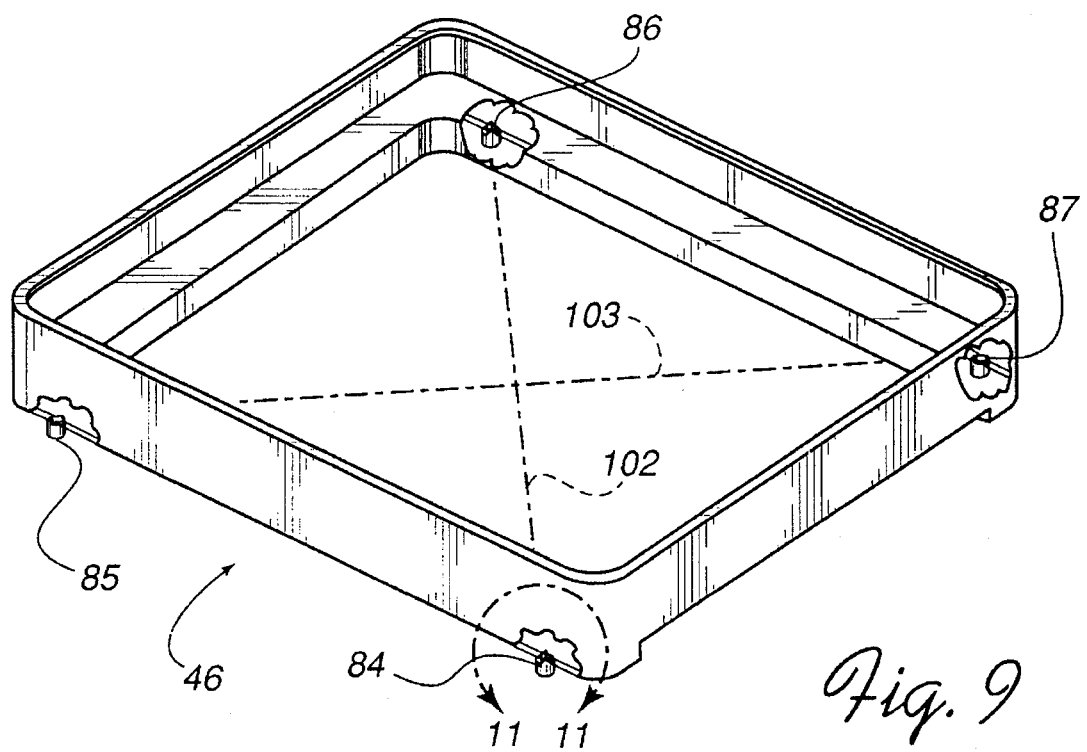
FIG. 9 is a perspective view showing a shield with knife edge features according to, the invention.

FIG. 9 shows a perspective view of the shield 46 showing cut away sections to highlight the knife edge support cylinders 84, 85, 86, 87 (which together with the knife edge grooves form a set (or plurality) of knife edge features) which loosely fit (a diametral clearance of approximately 0.006–0.015 in. (0.15–0.38 mm)) in matching vertically extending counterbores on the inside of the processing chamber 30. This configuration allows the cylinders to rotate to accommodate the orientation of the knife edge grooves, but effectively prevents the cylinder form moving laterally during expansion and contraction due to thermal cycling.

Figure 10:
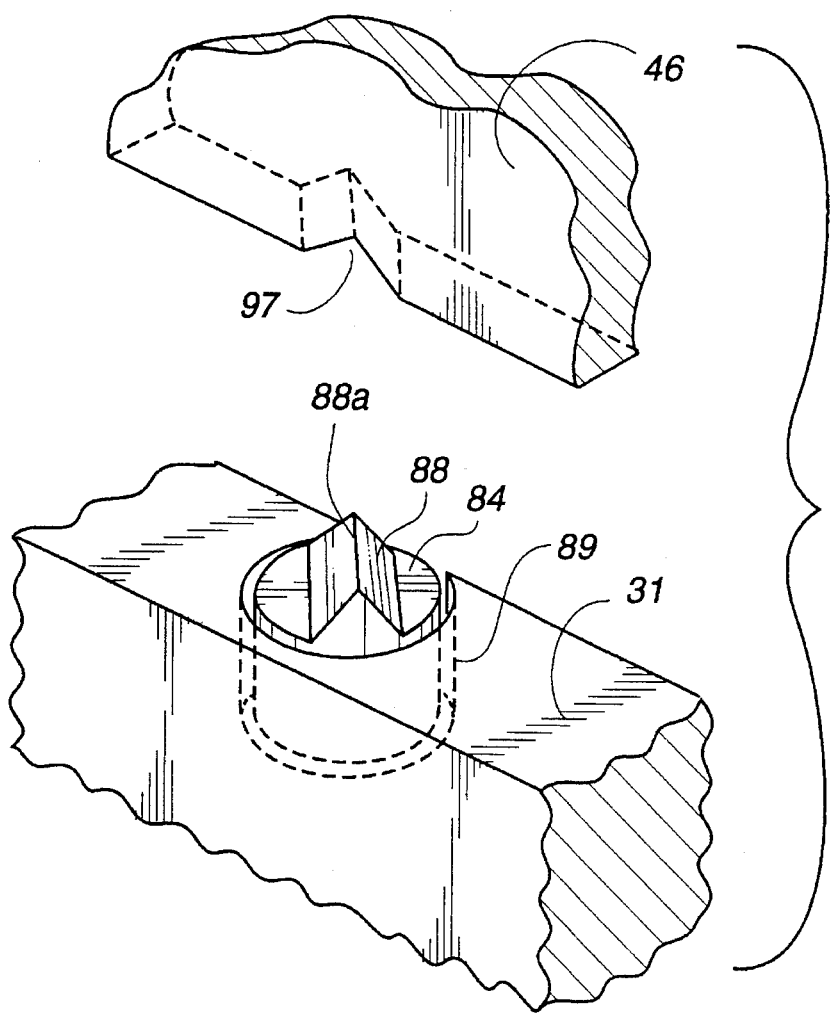
FIG. 10 is an exploded view of a knife edge feature of FIG. 11.
Figure 11:
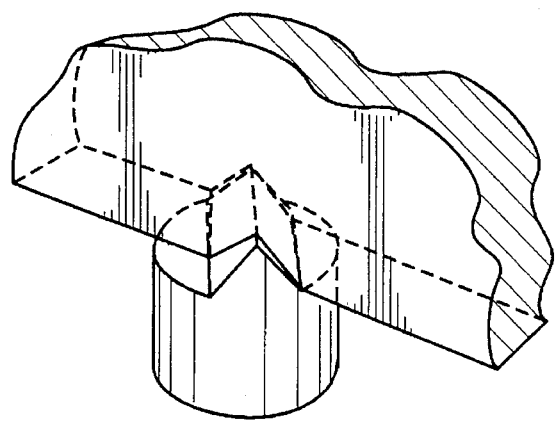
FIG. 11 a close-up view showing a knife edge feature of FIG. 9 identified as 11—11.
Figure 12:
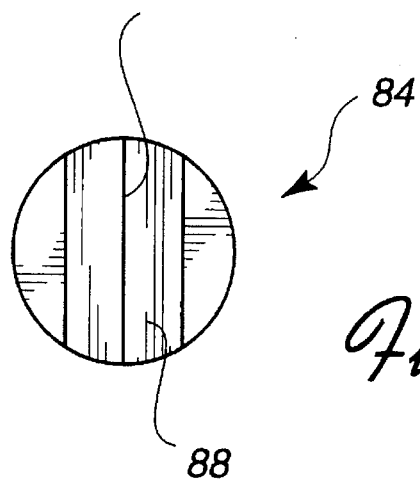
FIG. 12 shows a top plan view of a knife edge support cylinder according to the invention.
Figure 14:
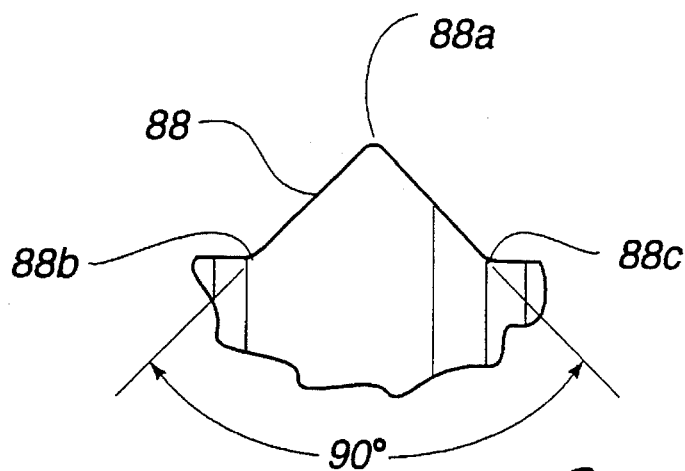
FIG. 14 shows a close-up view of the details of the protrusion forming the ridge for the knife edge support cylinder as shown in FIG. 12.

FIG. 10 shows a knife edge support cylinder 84 (as detailed in FIGS. 12, 13, and 14) wherein the knife edge support cylinder 84 has a diametrical protrusion or ridge 88 having a ridge line 88a. The cylinder or roller 84 has a diameter "D"(0.745"(18.9 mm)) and a base height "H"(0.5"(12.7 mm)), the ridge has a height of 0.189"(4.80 mm) and the triangular protrusion has a base 0.394"(10.0 mm) wide. This knife edge ridge 88 meets with the slotted knife edge receiving groove 97 as shown in FIG. 7. While the designation "knife edge" implies a line contact only at the ridge line 88a of the ridge 88, actually as shown in FIG. 14 the ridge line 88a is rounded as are the corners 88b, 88c between the flat top surface of the cylinder and the inclined surfaces of the ridge 88. The shield 46 is actually supported on the side inclined surfaces of the ridge 88 which distribute the load (weight of the shield) over their surface area and prevent damage due to unnecessarily high surface point loading. The knife edge support cylinders 84 can be made of a metal such as aluminum or stainless steel or can be made of a ceramic material. The shield 46 is isolated from the surrounding process chamber walls 31 by these knife edge supports and because of the minimal surface area and direct contact between the two, thermal losses due to conductive heat transfer are minimal. In some instances it may be desired to provide an electrical bias (different from the bias supplied to the target assembly) to the shield 46. In those instances a set of insulating knife edge supports (e.g. ceramic-alumina) isolate the shield 46 from the grounded chamber wall and an electrical bias (AC or DC) is provided to the shield. In other instances when grounding of the shield 46 is required, even though a set of conductive metal knife edge support cylinders support the shield 46, an extra grounding strap (not shown) secured between the shield 46 and chamber 30 will assure grounding.

When the knife edge support cylinder 84, as shown in FIGS. 9 and 10, is inserted in a precisely located counterbore 89 in the wall 31 of the chamber 30 and the knife edge support receiving groove 97 of the shield 46 is lowered into position, the ridge 88 of the knife edge support receiving groove 97 automatically angularly aligns the ridge 88 of the knife edge support cylinder 84 because of the loose fit of the cylinder 84 in the counterbore so that the knife edge support assembly is lined up width center line 102, as shown in FIG. 9. Similarly the knife edge support cylinder 86 is also aligned along the center line 102, while the other pair of knife edge support cylinders 85, 87 are aligned along the other center line 103. Expansion or contraction of the shield 46 will cause a lateral force attempting to misalign the knife edges or move the knife edge support cylinder 84 out of its counterbore. 89. However, before the knife edge ridges are misaligned or any actual movement of the knife edge occurs, the pieces will slide to a point of equilibrium. Because the two axes (center lines) 102, 103 cross at the vertical center line of the processing chamber, the shield configuration as described will maintain a generally uniform distance from the center of the processing chamber and uniform heating of the shield 46 will create a generally uniform expansion from the center in all directions.

Figure 15:
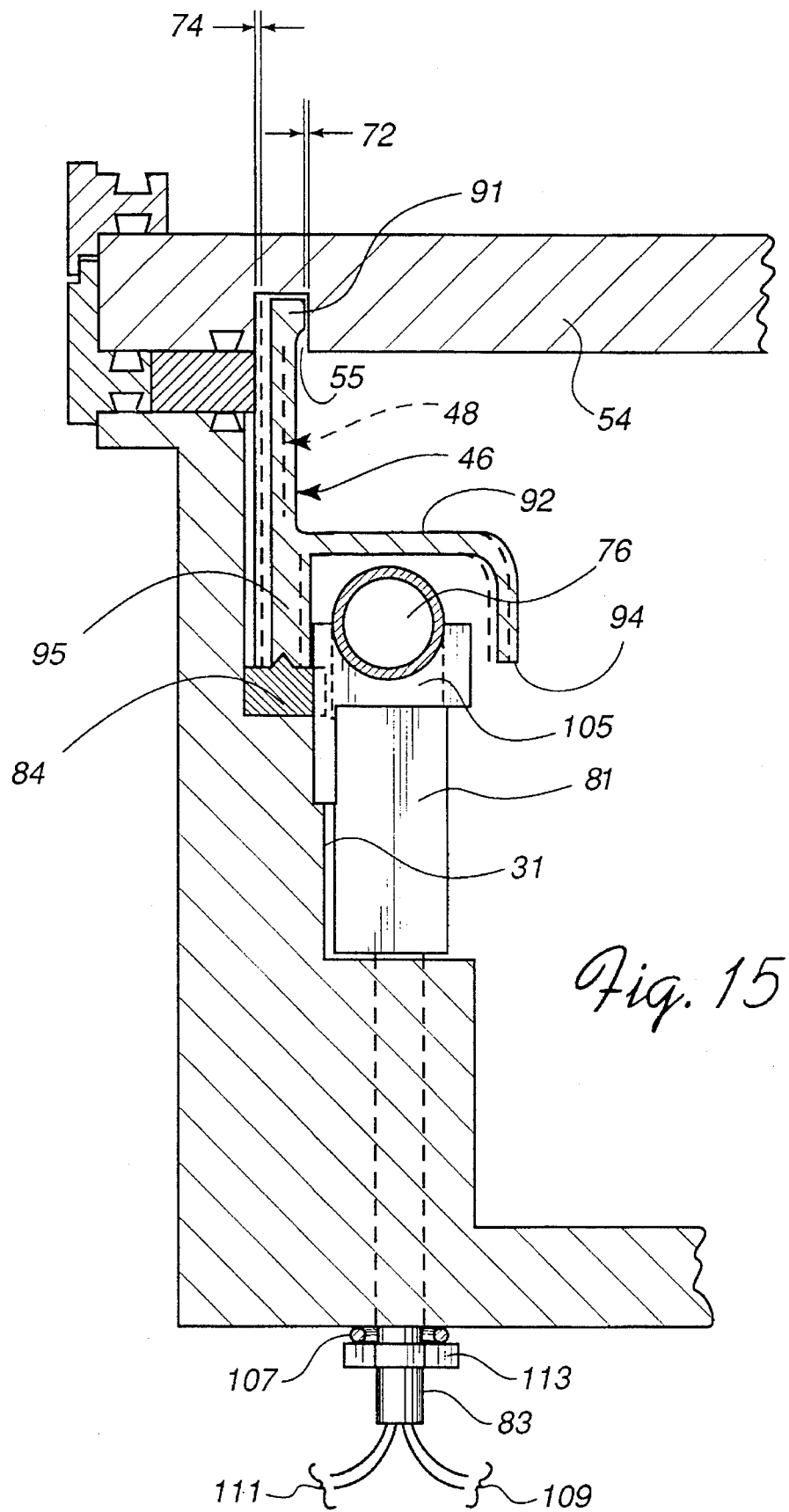
FIG. 15 is a close-up view of a shield and heater configuration according to the invention as shown in FIG. 3.

Heating the shield also assists in maintaining the clearance between the top edge of the shield 46 and the dark space groove (ring) 55 around the target 54 to prevent arcing between the target 54 and the shield 46 which could generate undesirable particulates. Expansion of the shield 46 will be in the same direction as the expansion of the target or target assembly 54 into whose dark space ring groove 55 the top leg 91 of the shield 46 extends, as shown in FIG. 15. Because of larger temperature variations in the shield the clearance between pieces will change somewhat.

The outline of the shield 46, shown in solid lines in FIG. 15, shows the shield location when the shield 46 is at ambient temperature. When the temperature of the shield 46 is increased, it expands uniformly such that it takes up a location showed by the dashed lines 48 illustrating the location of a thermally expanded shield. To prevent arcing between the top leg 91 of the shield 46 and the target 54, the inside clearance 72 and the outside clearance 74 between the shield 46 and the inside and outside edges, respectively, of the dark space ring groove 55 need to be maintained such that the discharge conditions of pressure, voltage, and clearance fall under the low end of Paschen's curve 115 as shown typically by the region 116 in FIG. 16 well below the minimum values represented by the lowest point 115a of the curve 115. The width dimension at the top of the top leg 91 of the shield is increased to achieve the desired clearance of 0.030"(0.76 mm) when cold. A typical sputtering process uses argon gas at 4 m torr to sputter an aluminum target with 10 KW at 450 volts with a target/shield inside clearance of 0.060–0.090" (1.52 mm–2.29 mm).

Figure 16:
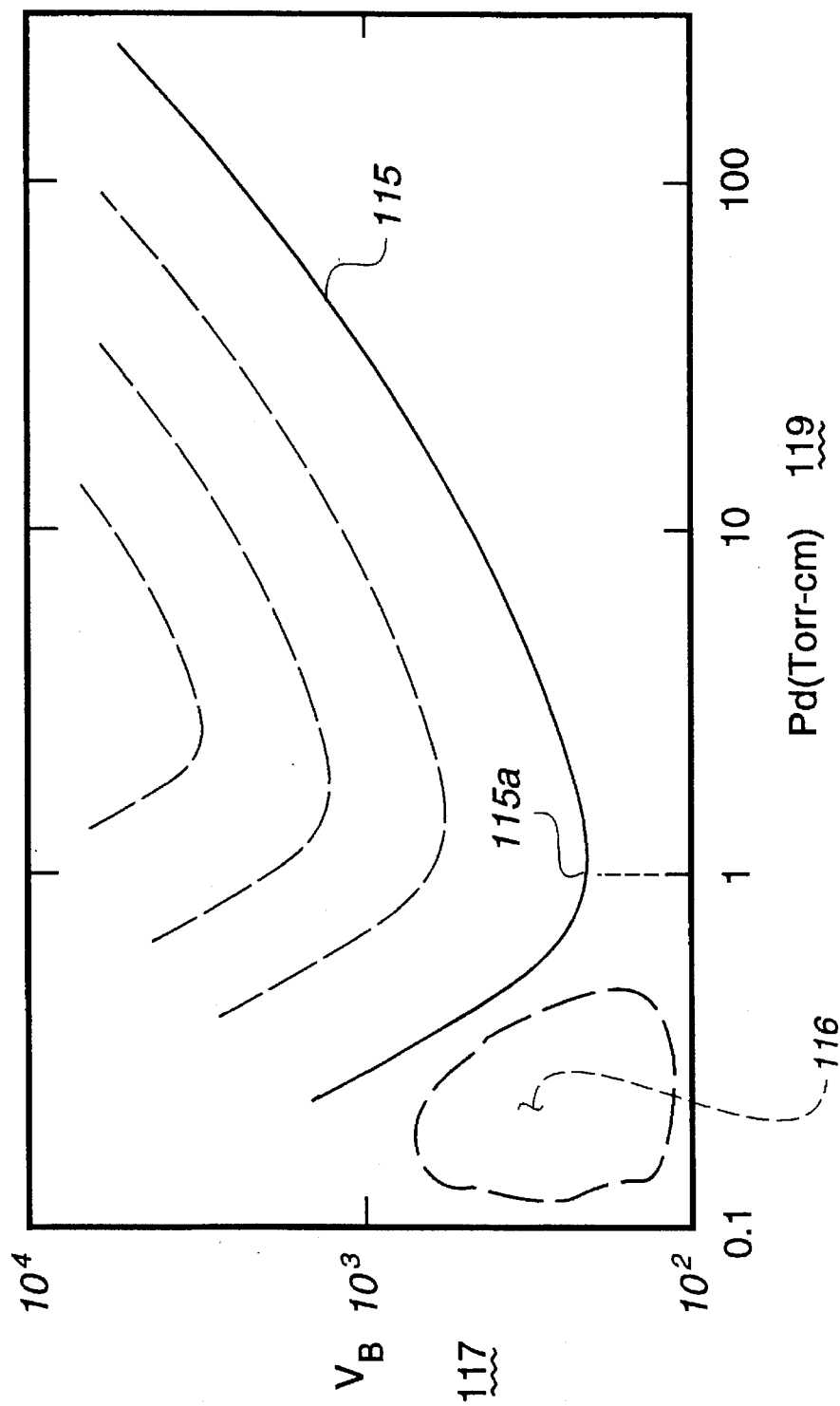
FIG. 16 is a typical Paschen's curve.

FIG. 16 shows a typical Paschen's curve for a particular gas wherein the X-axis 119 shows the product of the pressure multiplied by the separation distance (gap clearance) for a particular gas and the Y axis 117 shows breakdown voltage between the two conductive elements selected by the gas. Because of the large size of potential flat panel liquid crystal displays, e.g. 650 millimeters in one direction, the shield may possibly expand by as much as 5 millimeters due to thermal expansion. By maintaining the shield centered on the knife edges with, a temperature expansion in the same directions as the expansion of the target the change in the inner and outer clearances. 72, 74 are minimized and the possibility of arcing is reduced, if not eliminated. The shield 46 is maintained at different temperatures for different materials being sputtered. The shield temperature is determined by the temperature of the target material that is ejected (sputtered) by gas bombardment. Kinetic energy of the gas (e.g. argon) (which is constant) is converted to heat energy of the sputtered material. Therefore, if the target material has a light molecular weight, the shield temperature should be high and vice-versa. Typical shield temperatures for target materials are as follows: Al, 350° C.; ITO, 330° C.; Ta, 300° C.; and these temperatures should be maintained as close as possible (preferably within ±15° C.).

The shield is heated by a heater assembly consisting of four separate radiant heater units shown in FIGS. 15 and 18 located generally along the straight portions 47 (see FIG. 4) of the shield 46. The heater units are located under the bottom of the shield 46 (in the cross section of the shield, under the horizontally extending seat portion 92 of the chair or the lower arch of the "h") and generally between the two vertically extending leg portions 94 and 95. The temperature of the shield 46 is increased and controlled by varying and controlling the temperature of the heater units so that the temperature of the outside surface of the shield 46 closely approximates the temperature of the sputter deposited material. Under these conditions, when sputter deposited material arrives on the outside of the heated shield, very little, if any, temperature difference exists between the sputter deposited material and the shield so that when they are both cooled to ambient temperatures the interface stress due to differential thermal expansion is negligible. Ideally the shield is not permitted to cool. Thermal cycling which might contribute to release or peel off of sputter deposited material is avoided by using the heaters to maintain the temperature of the shield 46 at its normal operating temperatures in the range of approximately 250° C.–400° C. continuously. During sputtering the heaters provide only a small energy input as there is a large thermal energy input from the process. Between sputtering events, the heaters provide a large energy input to attempt to maintain the shield temperature at 250°–400° C. while the processed substrate is removed and a new substrate is brought into position for processing.

FIG. 18 shows a side view of a heater unit 76, an end view of which is shown in FIG. 15. The heater unit 76 includes a pipe sheath 126 which has a 90° miter at one end mating with a vertical leg 81 which connects to a heater stem 83 extending through a portion of the wall of the processing chamber 30. The stem passage is sealed by heater stem seal (e.g. O-ring) 107 and is secured by a threaded nut 113. The heater unit includes heater windings 127 which are wrapped inside the heater sheath 126; the windings extend and line the center of the horizontal leg of the heater sheath. A temperature sensor (e.g. a thermocouple) 128 is provided within the center of the windings 127 to assist in regulating the temperature of the heater unit 76. Power wiring 109 and temperature sensor wiring 111 is routed through the heater stem 83. The heater sheath 126 is made of a rigid thin walled material such as stainless steel, but under the high temperatures associated with the heater windings the end of the heater unit may droop. Therefore, a heater end support bracket 105 (as seen in FIG. 19) is provided at the end of the heater unit 76 to attach and align the heater end to the wall of the processing chamber and to keep the heater unit aligned within the bottom of the shield 46. The bracket 105 is bolted to the wall of the chamber 31.

The top surfaces and selected bottom surfaces of the shield are polished to a high gloss of 20 Ra (preferably 30 Ra or better) to minimize the surface adhesion of $H_2O$ molecules to rough surfaces which prevent a high vacuum from being reached in a short time when exposed to a high vacuum pumping system. The smooth surface reduces the molecular force of adhesion and reduces the time needed to pump down when compared to the time needed to pump down similar surfaces which are rough or unpolished.

The surfaces of the shield are treated so that the outside surface of the shield has a low emissivity (e.g. it is polished) while its inside surfaces facing the ends of the heaters have a high emissivity to better absorb the radiant heat received from the heater assembly. This difference in surface emissivities reduces the energy needed to heat the shield to process temperature and also reduces the time needed to heat the shield to a predetermined bake-out temperature (usually 450° C.).

Figure 17:
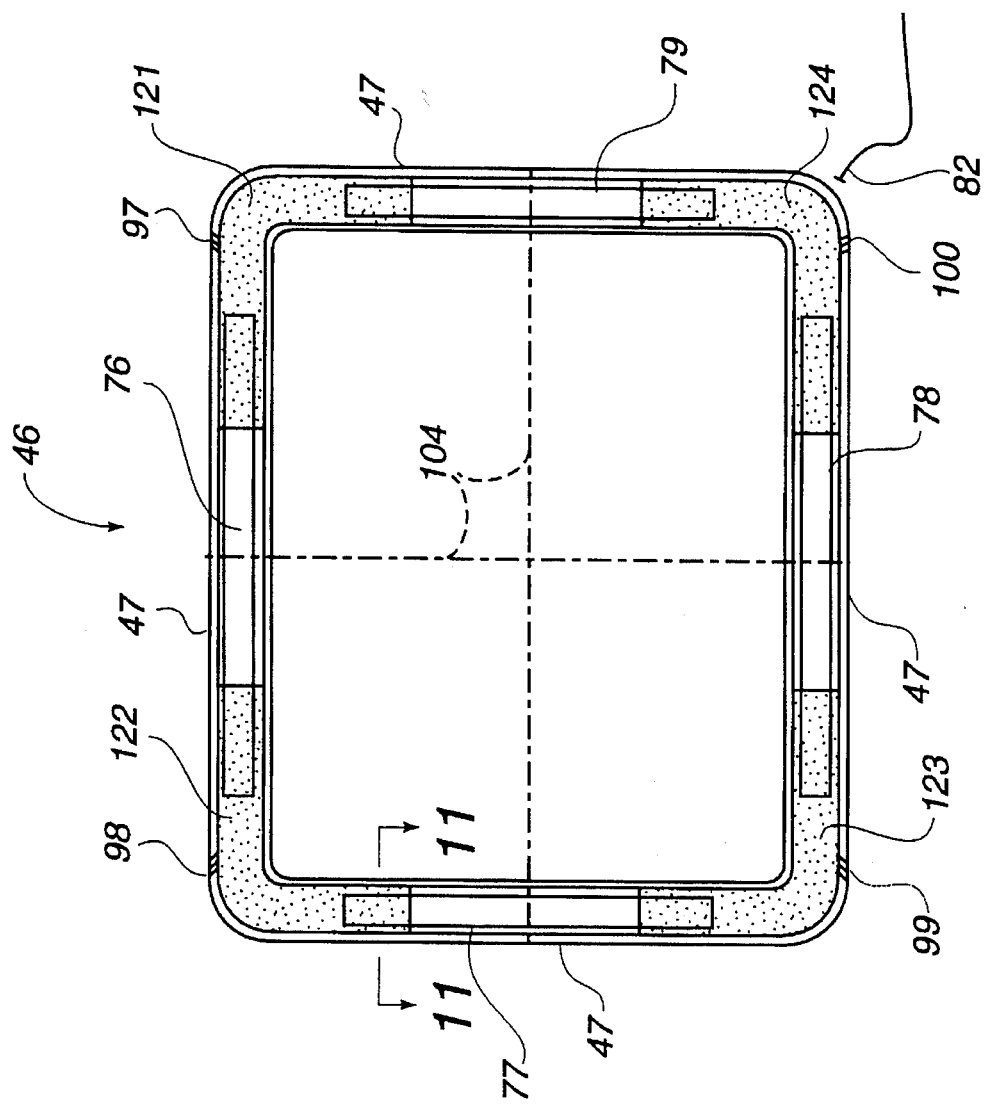
FIG. 17 shows a bottom view of a shield according to the invention showing typical locations for heater units when the shield is positioned in the processing chamber.

FIG. 17 shows a bottom view of the shield 46 and shows the outline of heater units 76, 77, 78, 79 to be located along the four straight sides 47 of the shield 46 and generally straddling the square center lines 104 of the shield 46. The corners of the shield 46 are not heated. In an effort to adjust for the absence of direct heating to the corners of the shield and average the temperature around the shield, in this configuration, different surface emissivities are provided at different locations on the bottom (inner) surface. High emissivity surface coatings (such as bead blasting or oxidation) are provided in the cross hatched areas 121,122, 123,124, near the corners while a low emissivity surface finish is provided in the region at the center of each straight side 47, such that the direct heating of the shield 46 in the area adjacent to the center lines 104, where the shield inside surface is highly polished (preferably 20 Ra, but within a range of 30 Ra or better) will provide lesser absorption of the radiation and will tend to average the temperature around the shield 46. The temperature of the shield which is expected to be generally uniform is measured by one non-contact thermocouple 82 (U.S. Pat. No. 5,105,200) located at one corner of the shield 46, as shown in FIG. 17.

Figure 21:
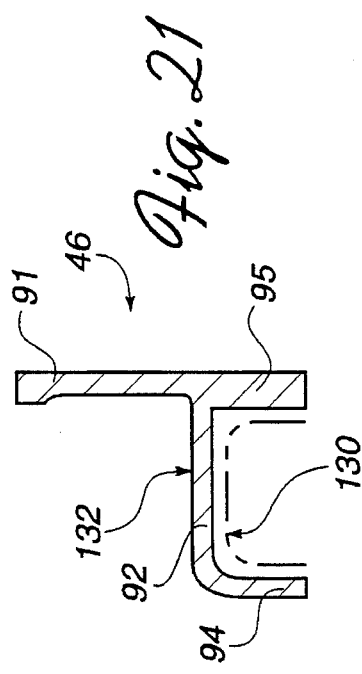
FIG. 21 shows a cross section of a shield of FIG. 4 taken at 21—21 identifying the areas where different coefficients of surface emissivity are located.

FIG. 21 shows a cross section of the first shield 46 as previously described. The dashed line 130 describes the area considered to be the shield surface near the heater. The designation 132 describes and denotes the surfaces other than the near heater surfaces. The outer leg 95, inner leg 94, seat (middle) 92, and top section 91 of the shield 46 are identified.

Figure 23:
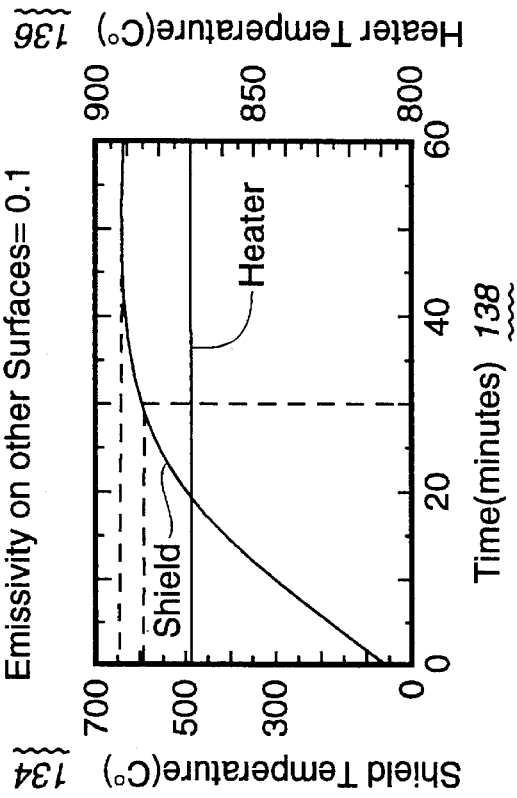
FIG. 23 is a graph showing shield temperature increase compared to a constant heater temperature for a shield according to the invention where the emissivity on the surface near the heater is high (i.e. 0.46) while the emissivity on the other surfaces of the shield are low (i.e. 0.1).
Figure 22:
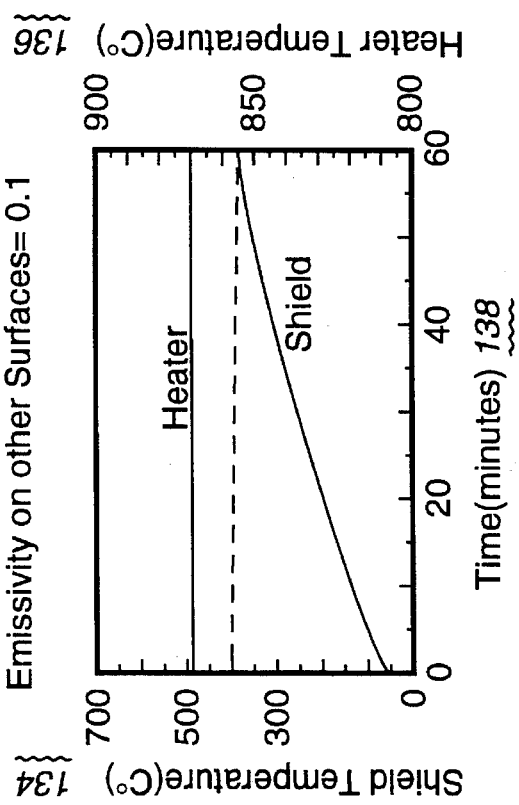
FIG. 22 is a graph showing shield temperature increase compared to a constant heater temperature where the emissivities on both the lower and upper sides of the shield are equal and negligible (i.e. 0.1)

FIG. 22 shows a graph of the near-heater surface shield temperature 136 Compared with the shield temperature 134 over time 138 when the emissivity of the near heater surfaces 130 is 0.1 and the emissivity of the other surface 132 is also 0.1. A cold (ambient temperature) shield is put in position over an already energized heater assembly at time 0 (zero). This is in contrast to FIG. 23 which shows the near-heater surface temperature 136 and shield temperature 134 for a shield 46 having an emissivity for the near-heater surfaces 130 of 0.46 and an emissivity on other surfaces 132 of 0.1 under similar conditions. The difference in performance and heat retention is substantial. It is expected that a minimum difference in the coefficient of surface emissivities between the near heater surface 130 and the other than near heater surfaces 132 of approximately 0.1 will create an advantageous effect in accordance with the invention in excess of the effect observed by normal variations in surface emissivity due to the variability of a manufacturing process.

FIG. 20 shows another shield configuration correlating to the cross section shown in FIG. 3. A second shield 47, otherwise similar to the previously described shield 46, also includes a generally continuous horizontal flange 51 extending towards the center of the chamber 30 and supports a set of shield knife edge protrusions (only protrusion 96 is shown in this view). There are four shield knife edge protrusions and they are aligned one to the other along diagonal axes (i.e. 102, 103 as previously described for the chamber knife edge protrusions) and cross at the center line of the chamber, similar to that shown for the knife edge support cylinders in FIG. 9. In this configuration the shield knife edge (pyramid-like) protrusions (e.g. 96) are fixed (preferably by welding) to the horizontal flange 51. In this configuration a Z-shaped shadow frame 43 takes the place of the substrate pedestal apron 40 and shadow frame 44 in the configuration of FIG. 3. This Z-shaped shadow frame 43 has a "Z" shaped cross section with its upper leg 43a extending toward the center of the chamber 30 over the edge of the substrate 66 being sputtered. The lower leg 43b extends outward from the center of the chamber to shade the horizontal flange 51 of the second shield 47. This overlap or shadowing prevents sputter deposited material from reaching the lower sections of the processing chamber 30 in a straight line path. The lower leg 43b of the shadow frame 43 also includes a series of shadow frame knife edge grooves (similar to those previously described for the shield perimeter) to match the location of the shield knife edge protrusions (e.g. 96) on the horizontal flange 51 of the second shield 47. With this configuration differential thermal expansion between the second shield 47 supporting the Z-shaped shadow frame 43 does not misalign these pieces with respect to the chamber's vertical central axis. While no chamber to shield knife edge support feature between the chamber wall and the second shield is shown in FIG. 20, it is preferred that such a feature be used to maintain alignment between the shield and the chamber together with the shield and shadow frame alignment.

The cycling of the temperature of the Z-shaped shadow frame 43 (temperature increases when a substrate is being sputtered and decreases when sputtering is halted to load and unload a new substrate), increases the possibility that sputter deposited material will disengage from, the Z-shaped shadow frame 43 and contaminate the substrate. To minimize such thermal cycling, the Z-shaped shadow frame 43 is indirectly heated by the heater assembly (e.g. 76) within the second shield 47. The heater assembly heats the second shield 47, as discussed for the configuration in FIGS. 2, 3, 15, and 17. However, rather than all upper and outer surfaces of the second shield being highly polished (e.g. to a finish of Ra 30 or better (preferably 20 Ra)), a section (horizontal band) of the inside leg 94 has an area 47a of high surface emissivity to face a similar area 43c of high surface emissivity on an outside surface of the Z-shaped shadow frame 43. Heating of the second shield 47 thereby causes its outside area 47a to emit radiation toward the Z-shaped shadow frame area 43c which absorbs a high portion of this radiation and thereby heats the Z-shaped shadow frame material to reduce the magnitude of the previously experienced thermal cycling. In this configuration, both the second shield 47 and the expanded shadow frame are preferably made of 316L S.S.

The invention thus provides a temperature-stable "shield" (including shadow frame) that is less prone to arcing and to peeling, thereby reducing particulates. The invention allows the shield temperature to quickly equilibrate with its associated heater assembly.

The embodiments of the structure of the invention as discussed above are used to carry out methods of reducing the contamination of a processing chamber by particulates.

A method includes the steps of while sputtering material from a target onto a substrate, determining the temperature of the material being sputter deposited on the shield, and heating the shield which is lining the processing chamber generally covering the wall of the processing chamber between a sputter target and a substrate being sputtered to approximately the temperature of the material being sputter deposited thereon.

An alternate method utilizing the invention of this application includes the steps of providing a first emissivity on a first side of the shield and providing a second emissivity on a second side of the shield, where the first emissivity is different from the second emissivity by a difference in the coefficients of emissivity of approximately 0.1 or more. This method further includes the steps of locating a set of individual heaters opposite a back side of the shield at one or more locations and providing a surface finish on the surface of the back side of the shield facing the heaters such that the surface directly adjacent to the heaters has a first emissivity and a surface on a location on the back side other than the surface facing the heaters has a second emissivity, where said first emissivity is greater than said second emissivity by a difference in the coefficient of emissivities of approximately 0.1 or more.

An alternate method according to the invention includes the steps of providing a heater assembly in a vacuum chamber; providing a shield configured to have an arch in which said heater assembly is generally contained, the shield having a top leg which extends from the arch to terminate adjacent to the target; and heating the shield by energizing the heater assembly.

An alternate method utilizing the invention for indirectly heating the shadow ring includes the steps of heating the shield from a first side, providing a high surface emissivity surface area on a second side of the shield facing a similar high emissivity surface area on a shadow frame in generally close proximity to the shield.

An alternate method utilizing the invention includes the steps of supporting the shield to have a generally equal clearance from the center of the processing chamber, including the steps of providing knife edge feature components to support a shield from a wall of the chamber, and providing a set of knife edge feature components in the edge of the shield to mate with the knife edge feature components supported from the wall of the chamber.

An alternate method of utilizing the invention includes providing a shield with a series of knife edge feature components, and providing a series of knife edge feature components in a shadow frame to mate with the knife edge feature components of the shield and support the shadow frame using the knife edge features.

While the invention has been described with regards to specific embodiments, those skilled in the art will recognize that changes can be made in form and detail without departing from the spirit and scope of the invention.

We claim:

1. A vacuum chamber apparatus comprising:
    a shield lining said vacuum processing chamber in which substrate processing is to be performed at a particular location in said chamber, said shield being configured to act as a barrier between a wall of said chamber and said particular location, said shield having an inner surface and an outer surface, wherein said shield is configured so that said inner surface generally faces away from said particular location in said processing chamber where processing is performed and said outer surface generally faces toward said particular location in said processing chamber where processing is performed, wherein said inner surface has a first surface emissivity and said outer surface has a second surface emissivity, wherein said first emissivity is higher than said second emissivity.

2. An apparatus as in claim 1,
    wherein said shield configuration includes an arch shaped cross section such that said inner surface is located on a concave surface of said arch and said outer surface is located on a convex surface of said arch.

3. An apparatus as in claim 2,
    wherein said arch shaped cross section forms a lower portion of an "h" shaped cross section for said shield and said inner surface is located inside the concave surfaces of said arch of said "h" shaped cross section and said outer surface includes the surfaces of said shield other than said inner surface including those surfaces on the convex surface of said arch.

4. The apparatus as in claim 3,
wherein a heater assembly is located in said chamber close to and facing a portion of said inner surface of said shield.

5. An apparatus as in claim 4,
wherein said heater assembly includes several heater units spaced along a perimeter of said shield,
wherein said inner surface includes a first center region surface area directly opposite from a center of a first of said several heater units, said center region surface area having a third surface emissivity,
wherein said inner surface includes an end or corner region surface area beginning at the edge of said center region surface area and extending beyond the end of a first of said several heater units to an edge of a second center region surface area opposite a second of said several heater units, said end region surface area having a fourth surface emissivity,
wherein said surface areas of third surface emissivity and fourth surface emissivity collectively effectively provide said first emissivity.

6. The vacuum chamber as in claim 5,
wherein said first emissivity differs from said second emissivity by a coefficient of emissivity of at least 0.1;
wherein said shield temperature is controlled at generally the same temperature as the temperature of the sputter deposited material deposited during the sputtering process;
wherein said shield is floatingly supported in said chamber by a set of knife edge support assemblies each having a knife edge ridge line aligned toward a center of said shield;
wherein one of said set of knife edge support assemblies includes a knife edge support cylinder having a ridge on a top surface thereof and a counterbore in said chamber to engage and receive a bottom and sides of said cylinder, such that when said knife edge support cylinder is disposed in said counterbore and a knife edge groove, configured to be aligned with said knife edge ridge line and to receive said ridge of said cylinder, in said shield is brought into contact with said ridge, said cylinder turns so that said knife edge ridge line of said knife edge support cylinder is aligned with said knife edge groove;
a generally rectangular pedestal within said chamber for supporting a rectangular substrate;
wherein said shield is disposed between said pedestal and walls of said vacuum chamber comprising four substantially straight sections joined by four curved sections, each said straight section including an arc-shaped portion facing toward a rear of said pedestal; and
four substantially straight radiant heater elements disposed adjacent to and at least partially within and extending along said arc-shaped portions of said straight section;
wherein said rearward facing surfaces of said central portions are polished to 40 Ra or more;
further comprising a "Z" type shaped shadow frame circumferentially surround said substrate support pedestal, said "Z" shaped frame having one leg extending over an edge of a substrate to be processed on said substrate support pedestal, said "Z" shaped frame acting as an apron for a perimeter of said substrate support pedestal, said "Z" shaped frame having a second leg extending as a flange towards a wall of the chamber;
wherein said shield supports a first set of knife edge protrusions; and
wherein said shadow frame is configured to include a first set of knife edge grooves to mate with said first set of knife edge protrusions, such that said shadow frame is supported on said first set of knife edge protrusions of said shield which are generally in contact with said first set of knife edge grooves.

7. The apparatus as in claim 2,
wherein a heater assembly is located in said chamber close to and facing a portion of said inner surface of said shield.

8. The apparatus as in claim 1,
wherein a heater assembly is located in said chamber close to and facing a portion of said inner surface of said shield.

9. The apparatus as in claim 1,
wherein said first emissivity differs from said second emissivity by a coefficient of emissivity of approximately 0.1 or more.

10. A processing chamber for processing a substrate, comprising:
a vacuum chamber in which said substrate is adapted to be supported, said chamber having an inner wall facing a processing region located over a surface of said substrate; and
a shield lining said inner wall, disposed inside said inner wall, and having an outer surface facing toward said processing region and an inner surface facing away from said processing region,
wherein said outer surface and selected portions of said inner surface are polished to have a surface finish of approximately 30 Ra or more.

11. A vacuum chamber as in claim 10,
wherein said inner surface has a first surface emissivity and said outer surface having a second surface emissivity, wherein said first emissivity is higher than said second emissivity.

12. The vacuum chamber as in claim 11,
wherein said inner surface is oxidized to provide said first emissivity.

13. A vacuum chamber as in claim 11,
wherein said first emissivity differs from said second emissivity by a coefficient of emissivity of approximately 0.1 or more.

14. A process for sputter deposition onto a substrate positioned in a processing region of a vacuum chamber having and a shield covering wall portions of said vacuum chamber between said target and said substrate, said process comprising the steps of:
sputtering material from said target onto said substrate to form sputter deposited material thereupon, and
during the sputtering step, controlling the temperature of said shield to a temperature substantially equal to the temperature of said sputter deposited material, wherein
said controlling step radiantly heats a surface of said shield facing away from said processing region by at least one heater disposed adjacent to a concave side of an arch shaped portion of said shield.

15. A sputtering process as recited in claim 14,
wherein said shield has an "h" type cross section and wherein a portion of said surface of said shield facing away from said processing region is located inside the lower arch of said "h" cross section and an outer surface of said shield includes the surfaces of said shield other than said portion of surface located inside the lower arch.

16. A sputtering process as recited in claim 15, wherein said surface inside said arched shaped portion has a first surface emissivity and the surfaces of said shield other than said portion of surface located inside the arched shaped portion have a second surface emissivity, wherein said first emissivity is higher than said second emissivity.

17. A sputtering process as recited in claim 16, wherein said first emissivity differs from said second emissivity by a coefficient of emissivity of approximately 0.1 or more.

18. A sputtering process as recited in claim 15, wherein said surface inside said lower arch has a first surface emissivity and the surfaces of said shield other than said portion of surface located inside the lower arch have a second surface emissivity, wherein said first emissivity is higher than said second emissivity.

19. A sputtering process as recited in claim 18, wherein said first emissivity differs from said second emissivity by a coefficient of emissivity of approximately 0.1 or more.

20. A processing chamber for processing a substrate, comprising:
   a vacuum chamber in which a said substrate is adapted to be supported, said chamber having an inner wall facing a processing region located over a surface of said substrate; and
   a shield lining said wall, disposed inside said inner wall, facing said processing region, and floatingly supported in said chamber by a plurality of knife edge support assemblies each having a knife edge alignment line aligned toward a center of said shield.

21. A processing chamber for processing a substrate as in claim 20,
   wherein one of said set of knife edge support assemblies includes a knife edge support cylinder having a ridge on a top surface thereof and a counterbore in said chamber to engage and receive a bottom and sides of said cylinder, such that when said knife edge support cylinder is disposed in said counterbore and a knife edge groove, configured to be aligned with said knife edge ridge line and to receive said ridge of said cylinder, in said shield is brought into contact with said ridge, said cylinder turns so that said knife edge ridge line of said knife edge support cylinder is aligned with said knife edge groove.

22. A chamber for processing a rectangular substrate, comprising:
   a vacuum chamber;
   a generally rectangular pedestal within said chamber for supporting a rectangular substrate;
   a shield member disposed between said pedestal and walls of said vacuum chamber, comprising four substantially straight sections joined by four curved sections, each said straight section including an arc-shaped portion facing toward the rear of said pedestal; and
   four substantially straight radiant heater elements disposed adjacent to and at least partially within and extending along said arc-shaped portions of said straight section.

23. A chamber for processing a rectangular substrate, as recited in claim 22, wherein said four curved sections do not have radiant heating elements extending therealong.

24. A chamber for processing a rectangular substrate, as recited in claim 23,
   wherein said curved portions also include arc-shaped portions facing toward the rear of said pedestal, and
   wherein rearward facing surfaces of said arc-shaped potions of said curved portions and first rearward facing surfaces of end portions of said arc-shaped portions of said straight sections have substantially higher emissivity than second rearward facing surfaces of central portions of said arc-shaped portions of said straight sections.

25. A chamber for processing a rectangular substrate, as recited in claim 24,
   wherein said rearward facing surfaces of said central portions are polished to 40 Ra or more.

26. A chamber for processing a rectangular substrate, as recited in claim 22, further comprising
   a sputtering target disposed facing said pedestal add wherein said shield includes a portion extending vertically from said arc-shaped portions of said straight and curved sections into an annular groove formed around a periphery of said sputtering target, said vertically extending portion being separated from said sputtering target.

27. A chamber comprising:
   an "h" shaped shield lining a portion of a wall of said chamber spanning an area between a sputter target and a support for a substrate on which target material is to be sputter deposited.

28. A chamber as in claim 27,
   wherein a heater assembly is positioned under the arch of the lower portion of said "h" shape.

29. A chamber as in claim 28, wherein said shield is generally rectangularly shaped to match a rectangular shape of said chamber.

30. The vacuum chamber as in claim 29,
   wherein a portion of the surface of said shield lining facing said heater assembly is oxidized to provide an increased coefficient of surface emissivity at said portion.

31. A chamber comprising:
   a "Z" type shaped shadow frame circumferentially surrounding a substrate support pedestal, said "Z" shaped frame having one leg extending over an edge of a substrate to be processed on said substrate support pedestal thereby preventing said edge from being sputter deposited, said "Z" shaped frame acting as an apron for a perimeter of said substrate support pedestal, said "Z" shaped frame having a second leg extending as a flange towards a wall of the chamber.

32. A chamber comprising:
   a shield supporting a first element of a first set of knife edge protrusions and grooves, wherein an element of said first set of knife edge protrusions and grooves is either a knife edge protrusion or a knife edge groove of said first set configured to mate with one another;
   a shadow frame configured to include a second element of said first set of knife edge protrusions and grooves to mate with said first element of said first set of knife edge protrusions and grooves, such that said shadow frame is supported on said first element of said first set of knife edge protrusions and grooves of said shield which are generally in contact with said second element of said first set of knife edge protrusions and grooves of said frame.

33. A chamber as in claim 32, further comprising:

a second set of knife edge protrusions supported in a wall of said chamber;

wherein said shield includes a second set of knife edge grooves to mate said second set of knife edge protrusions, such that said shield is supported on said second set of knife edge protrusions of said chamber wall which are generally in contact with said second set of knife edge grooves.

34. A method for indirectly heating a shadow ring in a vacuum processing chamber, which comprises the steps of:

heating a shield from a first side, providing a high surface emissivity surface area on a second side of the shield facing a similar high emissivity surface area on a surface of a shadow frame in generally close proximity to the shield.

* * * * *